(12) United States Patent
Fujie

(10) Patent No.: US 11,382,246 B2
(45) Date of Patent: Jul. 5, 2022

(54) SUBSTRATE WORK SYSTEM UNDER ADJUSTABLE RAIL SPACING DISTANCE

(71) Applicant: FUJI CORPORATION, Chiryu (JP)

(72) Inventor: Isao Fujie, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 148 days.

(21) Appl. No.: 16/646,617

(22) PCT Filed: Oct. 6, 2017

(86) PCT No.: PCT/JP2017/036410
§ 371 (c)(1),
(2) Date: Mar. 12, 2020

(87) PCT Pub. No.: WO2019/069438
PCT Pub. Date: Apr. 11, 2019

(65) Prior Publication Data
US 2020/0229330 A1    Jul. 16, 2020

(51) Int. Cl.
*H05K 13/00* (2006.01)
*H05K 13/08* (2006.01)
*G05B 19/418* (2006.01)

(52) U.S. Cl.
CPC ..... *H05K 13/0069* (2013.01); *G05B 19/4189* (2013.01); *H05K 13/0882* (2018.08);
(Continued)

(58) Field of Classification Search
USPC ........................................................ 700/113
See application file for complete search history.

(56) References Cited

U.S. PATENT DOCUMENTS 7,219,787 B2 * 5/2007 Kabeshita .......... H05K 13/0411
198/346.2
2009/0126187 A1   5/2009 Kajiyama et al.
(Continued)

FOREIGN PATENT DOCUMENTS

JP    63-77191 A    4/1988
JP    9-219599 A    8/1997
(Continued)

OTHER PUBLICATIONS

International Search Report dated Jan. 9, 2018 in PCT/JP2017/036410 filed on Oct. 6, 2017, 2 pages.

*Primary Examiner* — Md Azad
(74) *Attorney, Agent, or Firm* — Oblon, McClelland, Maier & Neustadt, L.L.P.

(57) ABSTRACT

A board work system including: a conveying and holding device including a pair of rails configured to support a board, and a changing mechanism configured to change a distance between the pair of rails, the conveying and holding device being configured to convey the board supported by the rails and hold the board at a work position; a work device configured to perform work with respect to the board held by the conveying and holding device from an underside of the board; a moving device configured to move the work device; and a control device, the control device including an acquiring section configured to acquire a rail spacing distance that is the distance between the pair of rails, and an operation control section configured to control operation of the moving device based on the rail spacing distance acquired by the acquiring section.

2 Claims, 9 Drawing Sheets

(52) U.S. Cl.
CPC ............ *G05B 2219/45026* (2013.01); *G05B 2219/45054* (2013.01)

(56) References Cited

U.S. PATENT DOCUMENTS

| | | | |
|---|---|---|---|
| 2009/0295053 | A1 | 12/2009 | Farlow et al. |
| 2012/0032384 | A1* | 2/2012 | Lin .................... H05K 13/0069 269/151 |
| 2015/0318198 | A1* | 11/2015 | Kuwahara ............... H01L 21/68 414/222.02 |
| 2016/0165770 | A1* | 6/2016 | Kato ................. H05K 13/0404 29/739 |
| 2016/0330880 | A1* | 11/2016 | Morikawa ............ H05K 13/021 |
| 2020/0006099 | A1* | 1/2020 | Yamauchi .............. H05K 13/00 |

FOREIGN PATENT DOCUMENTS

| | | | |
|---|---|---|---|
| JP | 2000-174499 A | 6/2000 | |
| JP | 2008-4856 A | 1/2008 | |
| JP | 2009-94160 A | 4/2009 | |

\* cited by examiner

SUBSTRATE WORK SYSTEM UNDER ADJUSTABLE RAIL SPACING DISTANCE

TECHNICAL FIELD

The present application relates to a board work system for performing work with respect to a board held by a conveying and holding device from an underside of the board.

BACKGROUND ART

In a known board work system for performing work with respect to a board held by a conveying and holding device, as disclosed in the patent literature below, there is a board conveying and holding device that includes a pair of rails that support the board, with a rail spacing distance that is a distance between the pair of rails being adjustable.

CITATION LIST

Patent Literature

Patent literature 1: JP-A-2000-174499

BRIEF SUMMARY

Technical Problem

With a board work system provided with a conveying and holding device for which the rail spacing distance can be changed, when performing work with respect to the board form an underside of the board that is being held by the conveying and holding device, if the rail spacing distance is changed, there is a worry that interference will occur between the conveying and holding device and a work device that performs the work. The present disclosure takes account of such circumstances and an object thereof is to prevent interference between a work device and a conveying and holding device.

Solution to Problem

To solve the above problems, disclosed herein is a board work system including: a conveying and holding device including a pair of rails configured to support a board, and a changing mechanism configured to change a distance between the pair of rails, the conveying and holding device being configured to convey the board supported by the rails and hold the board at a work position; a work device configured to perform work with respect to the board held by the conveying and holding device from an underside of the board; a moving device configured to move the work device; and a control device, the control device including an acquiring section configured to acquire a rail spacing distance that is the distance between the pair of rails, and an operation control section configured to control operation of the moving device based on the rail spacing distance acquired by the acquiring section.

Advantageous Effects

According to the present disclosure, operation of the moving device configured to move the work device is controlled based on the rail spacing distance. Thus, it is possible to appropriately prevent interference between the work device and the conveying and holding device.

DESCRIPTION OF EMBODIMENTS

The following describes in detail referring to the figures an example embodiment of the present disclosure.

(A) Configuration of Component Mounter

Figure 1:
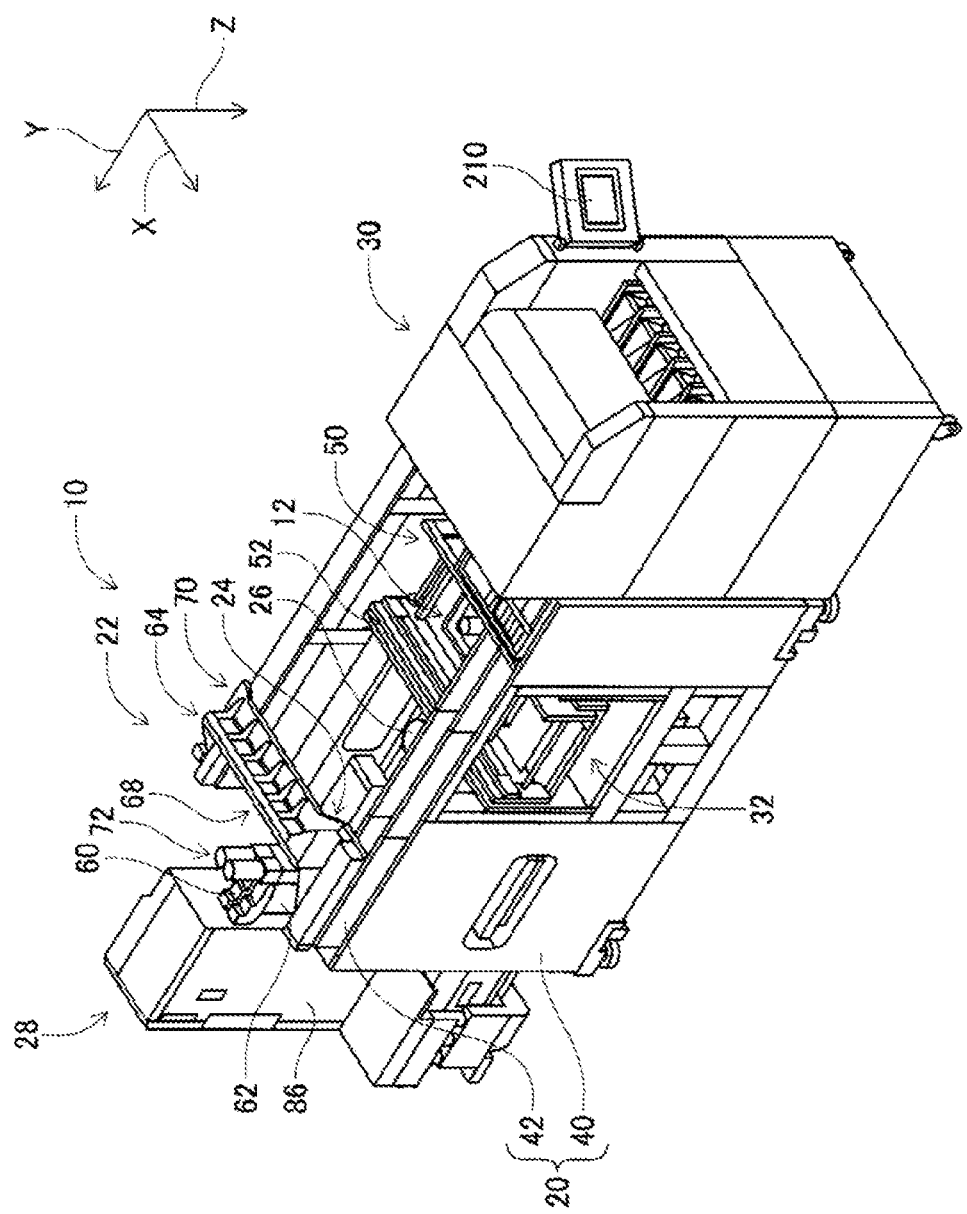
FIG. 1 is a perspective view of a component mounter.

FIG. 1 shows component mounter 10. Component mounter 10 performs work of mounting components on circuit board 12. Component mounter 10 is provided with device main body 20, component mounting device 22, mark camera 24, component camera 26, component supply device 28, loose component supply device 30, board conveying and holding device 32, cut and clinch unit 34 (refer to FIG. 3), unit moving device 36 (refer to FIG. 3), and control device 38 (refer to FIG. 7). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on frame section 40. Note that, in the descriptions below, the width direction of device main body 20 is referred to as the X direction, the front-rear direction of device main body 20 is referred to as the Y direction, and the vertical direction is referred to as the Z direction.

Figure 2:
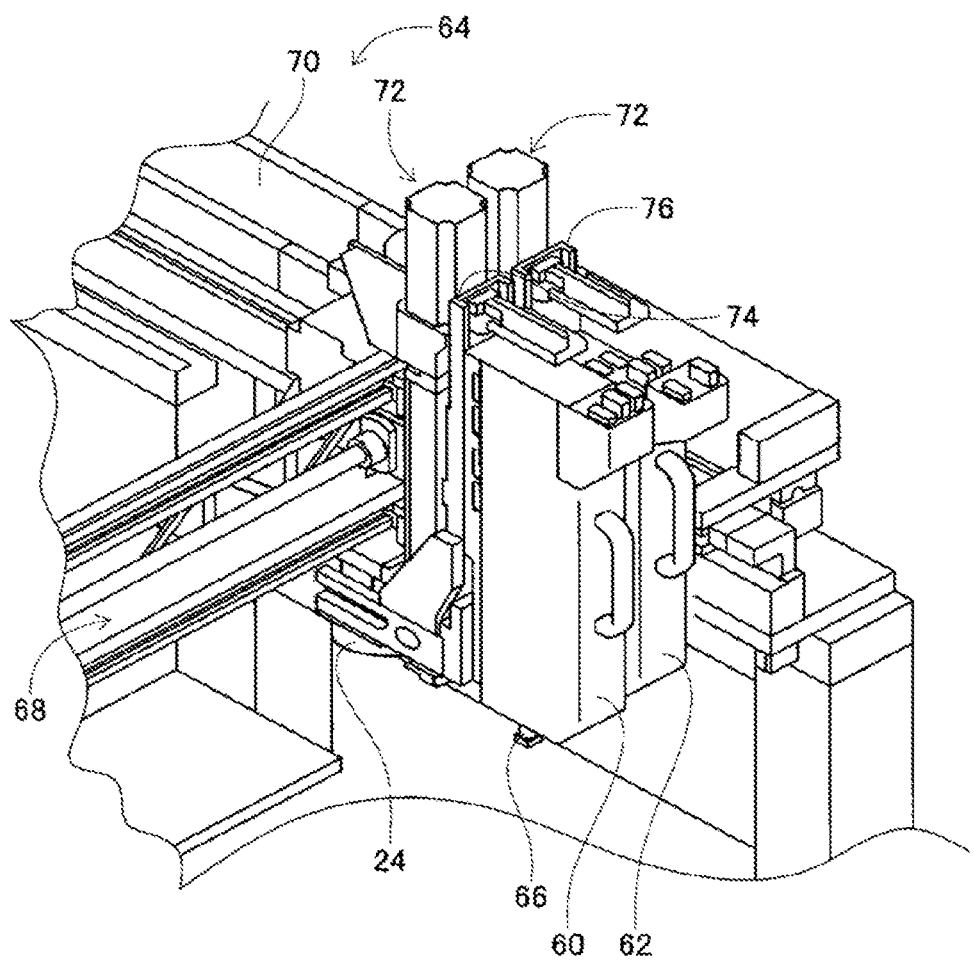
FIG. 2 is a perspective view of a component mounting device.

Component mounting device 22 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Further, as shown in FIG. 2, mark camera 24 is attached to slider 74 in a state facing downwards. By this, mark camera 24 is moved together with work head 60 in the X, Y, and Z directions so as to image any given position on frame section 40. As shown in FIG. 1, component camera 26 is provided in a state facing upwards on frame section 40 between component supply device 28 and board conveying and holding device 32. Thus, component camera 26 images a component held by suction nozzle 66 of work heads 60 or 62.

Component supply device 28 is provided at an end of frame section 40 in the front-rear direction. Component supply device 28 includes tray-type component supply device 86 and feeder-type component supply device 88 (refer to FIG. 7). Tray-type component supply device 86 supplies components in a state arranged in a tray. Feeder-type component supply 88 device supplies components via a tape feeder or stick feeder (not shown).

Loose component supply device 30 is provided at the other end of frame section 40 in the front-rear direction. Loose component supply device 30 lines up multiple components that are in a scattered state, and supplies the components in a lined-up state. That is, this device arranges multiple components that have random orientations to have a specified orientation and supplies the components in the specified orientation.

Note that, components supplied by component supply device 28 and loose component supply device 30 may include electronic circuit components, configuration components of solar panels, configuration components of power modules, and the like. Also, electronic circuit components include components with leads and components without leads.

Figure 3:
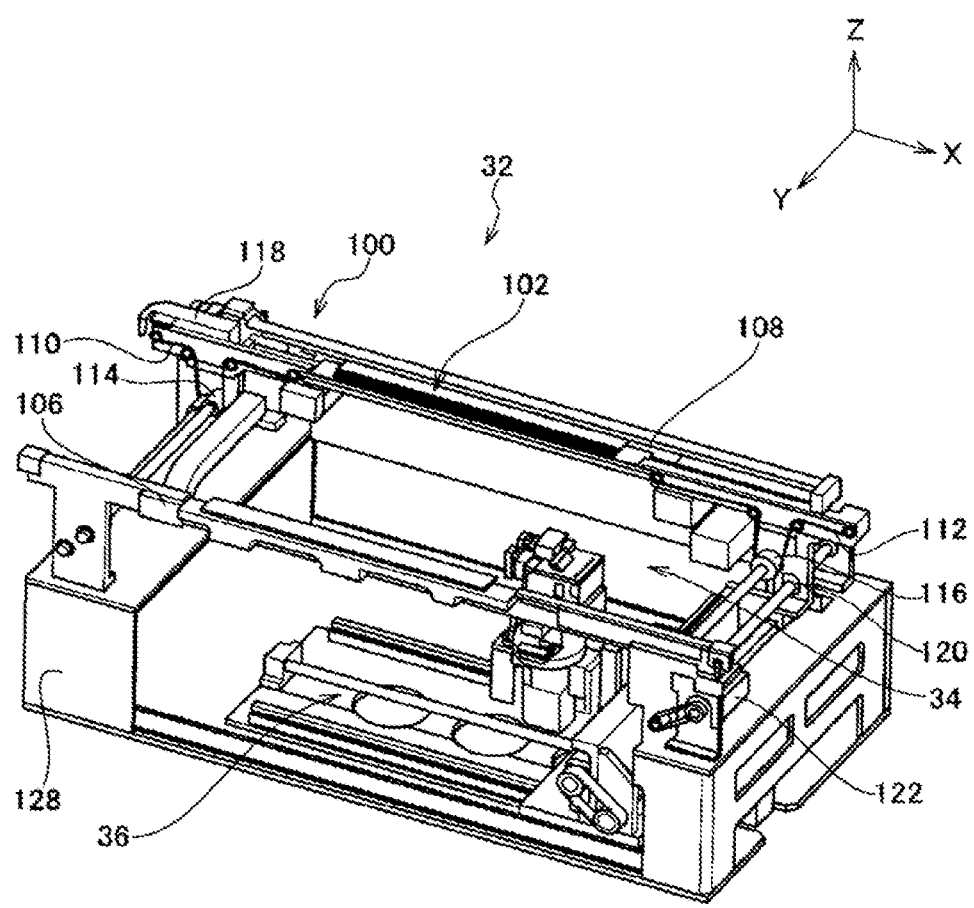
FIG. 3 is a perspective view of a board conveying and holding device, a cut and clinch unit, and a unit moving device.

Board conveying and holding device 32 is positioned centrally inside frame section 40 in the front-rear direction, and, as shown in FIG. 3, includes conveyance device 100 and clamp device 102. Conveyance device 100 conveys circuit board 12, and includes pair of guide rails 106 and 108. Pair of guide rails 106 and 108 are arranged parallel extending in the X direction.

First conveyor belt 110 is provided extending in the X direction on the ends of each guide rail 106 and 108 in the X direction, and second conveyor belt 112 is provided extending in the X direction on the other ends of guide rails 106 and 108. Further, first conveyor belt 110, by the driving of electromagnetic motor 114, revolves in the clockwise direction as shown in FIG. 3, and second conveyor belt 112, by the driving of electromagnetic motor 116, revolves in the same direction as first conveyor belt 110.

Thus, circuit board 12 supported by first conveyor belts 110 of pair of guide rails 106 and 108 is loaded into component mounter 10, and circuit board 12 supported by second conveyor belts 112 of pair of guide rails 106 and 108 is unloaded from component mounter 10. Thus, the side with first conveyor belts 110 is referred to as the upstream side and the side with second conveyor belts 112 is referred to as the downstream side. Note that, first conveyor belts 110 and second conveyor belts 112 are separated in the X direction by a distance longer than the length dimension of circuit board 12, and clamp device 102 is provided between first conveyor belts 110 and second conveyor belts 112.

Also, shuttle 118 is provided at an end section of guide rail 108 at which first conveyor belts 110 are provided. Shuttle 118 is provided to be slidable along guide rails 118 and by shuttle 118 sliding from the upstream side to the downstream side circuit board 12 loaded via conveyor belts 110 is conveyed to conveyor belts 112 via clamp device 102.

Further, as described above, clamp device 102 is provided between first conveyor belts 110 and second conveyor belts 112. Clamp device 102 clamps circuit board 12 conveyed between first conveyor belts 110 and second conveyor belts 112. The position at which circuit board 12 is clamped by clamp device 102 is the work position with respect to circuit board 12.

That is, with conveying and holding device 32, circuit board 12 is loaded into component mounter 10 by first conveyor belts 110, and the loaded circuit board 12 is conveyed between first conveyor belts 110 and second conveyor belts 112 by shuttle 118. Next, between first conveyor belts 110 and second conveyor belts 112, circuit board 12 is clamped by clamp device 102 and work is performed with respect to circuit board 12. Continuing, when work with respect to circuit board 12 is complete, clamp device 102 releases the clamping and circuit board 12 is conveyed to second conveyor belts 112 by shuttle 118. Then, circuit board 12 is unloaded from component mounter 10 via second conveyor belts 112. In this manner, board conveying and holding device 32 loads circuit board 12 into component mounter 10, clamps circuit board 12 at the work position, and unloads circuit board 12 from component mounter 10.

Note that, board conveying and holding device 32 includes changing mechanism 120 configured to change the distance between guide rails 106 and 108 (hereinafter referred to as "rail spacing distance"), and by changing the rail spacing distance, it is possible to convey circuit boards 12 of various sizes. In detail, guide rail 108 is held by changing mechanism 120 to be slidable in a state remaining parallel to guide rail 106. Guide rail 108 changes the rail spacing distance by being slid by the driving of electromagnetic motor 122. Thus, board conveying and holding device 32 is able to convey circuit boards 12 of various sizes. Note that, electromagnetic motor 122 is provided with an encoder such that the rail spacing distance can be changed freely by using feedback control based on a detection value of the encoder.

Further, cut and clinch unit 34 and unit moving device 36 are provided inside board conveying and holding device 32. Unit moving device 36 is fixed to an upper surface of a lower plate that configures housing 128 of board conveying and holding device 32, and by operation of unit moving device 36, cut and clinch unit 34 can be moved to any given position. Note that, cut and clinch unit 34 moves under circuit board 12 that is conveyed and held by board conveying and holding device 32.

Figure 4:
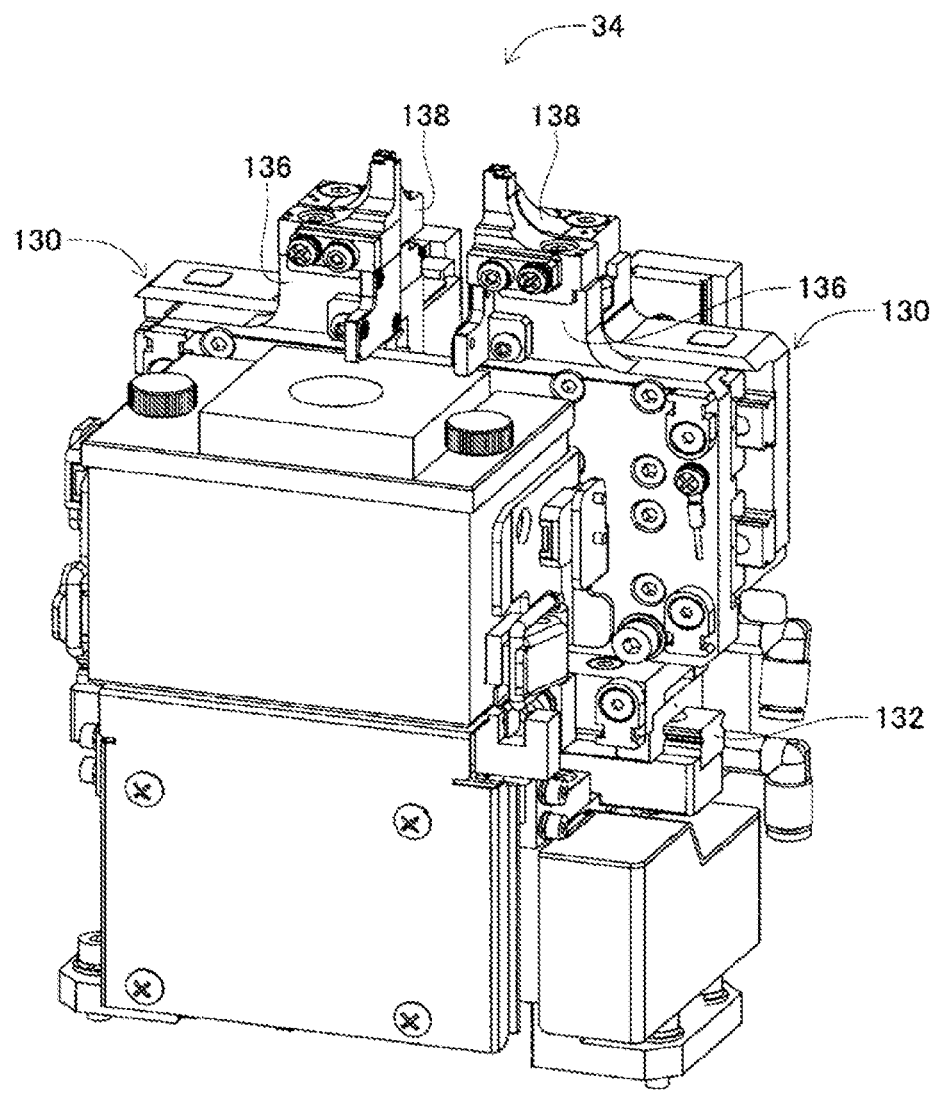
FIG. 4 is a perspective view of a cut and clinch unit.

In detail, as shown in FIG. 4, cut and clinch unit 34 includes pair of slide bodies 130. Pair of slide bodies 130 are slidably supported by slide rails 132 provided extending in the X direction. By sliding slide bodies 130 by driving electromagnetic motor 34 (refer to FIG. 7), it is possible to change the distance between pair of slide bodies 130.

Further, each of the pair of slide bodies 130 includes fixed section 136 and movable section 138, and is supported at fixed section 136 so as to be slidable on slide rail 132. Also, movable section 138 is held by fixed section 136 to be slidable in the X direction. Further, movable section 138, by the driving of electromagnetic motor 140 (refer to FIG. 7) is controlled to slide in the X direction with respect to fixed section 136.

Figure 5:
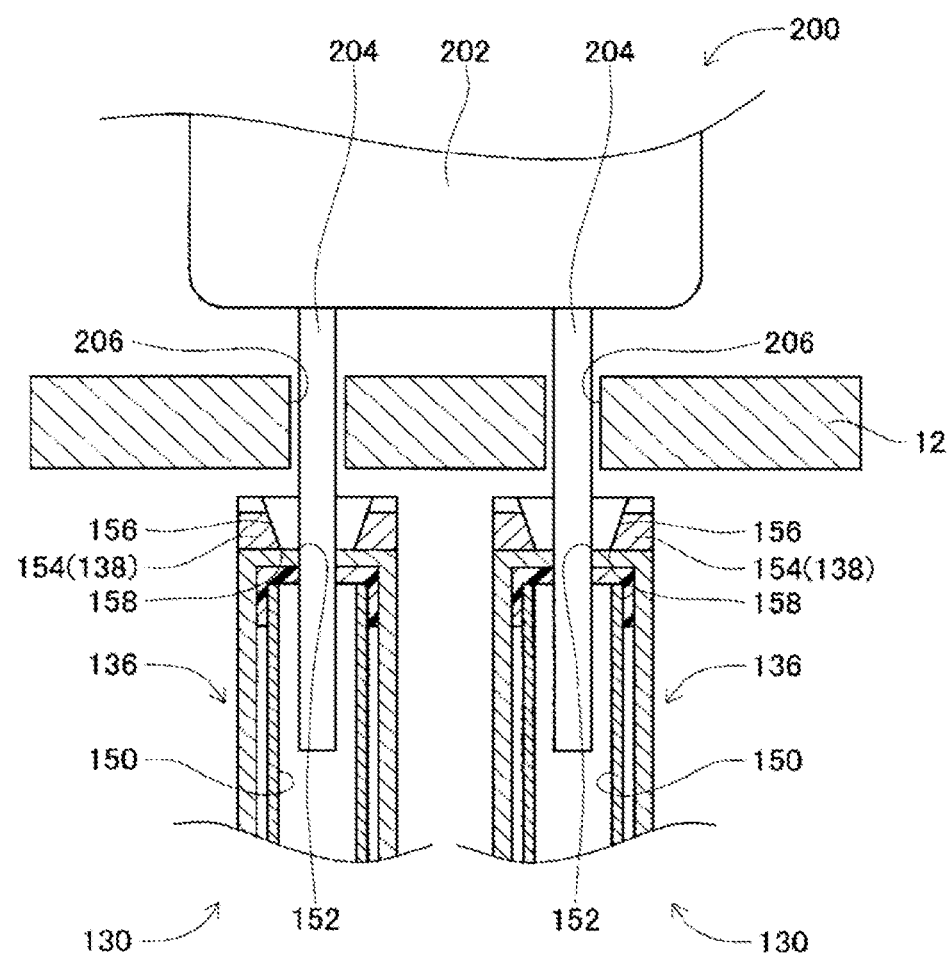
FIG. 5 is a schematic drawing showing the cut and clinch unit when cutting and bending leads of a leaded component.

Also, as shown in FIG. 5, the upper end section of fixed section 136 is formed tapered towards the end, and first insertion hole 150 is formed so as to pierce the upper end section in a vertical direction. Further, the edge of first insertion hole 150 that opens to the upper end surface is formed as fixed blade 152. On the other hand, an upper end section of movable section 138 is also formed tapered towards the end, and L-shaped curved section 154 is formed at the upper end section of movable section 138. Curved section 154 extends up from the upper end surface of fixed section 136. Further, first insertion hole 150 that opens at the upper end surface of fixed section 136 is covered by curved section 154, and second insertion hole 156 is formed in curved section 154 so as to face first insertion hole 150. Note that, the edge of second insertion hole 156 that opens to the lower end surface of curved section 154 is formed as movable blade 158.

Figure 6:
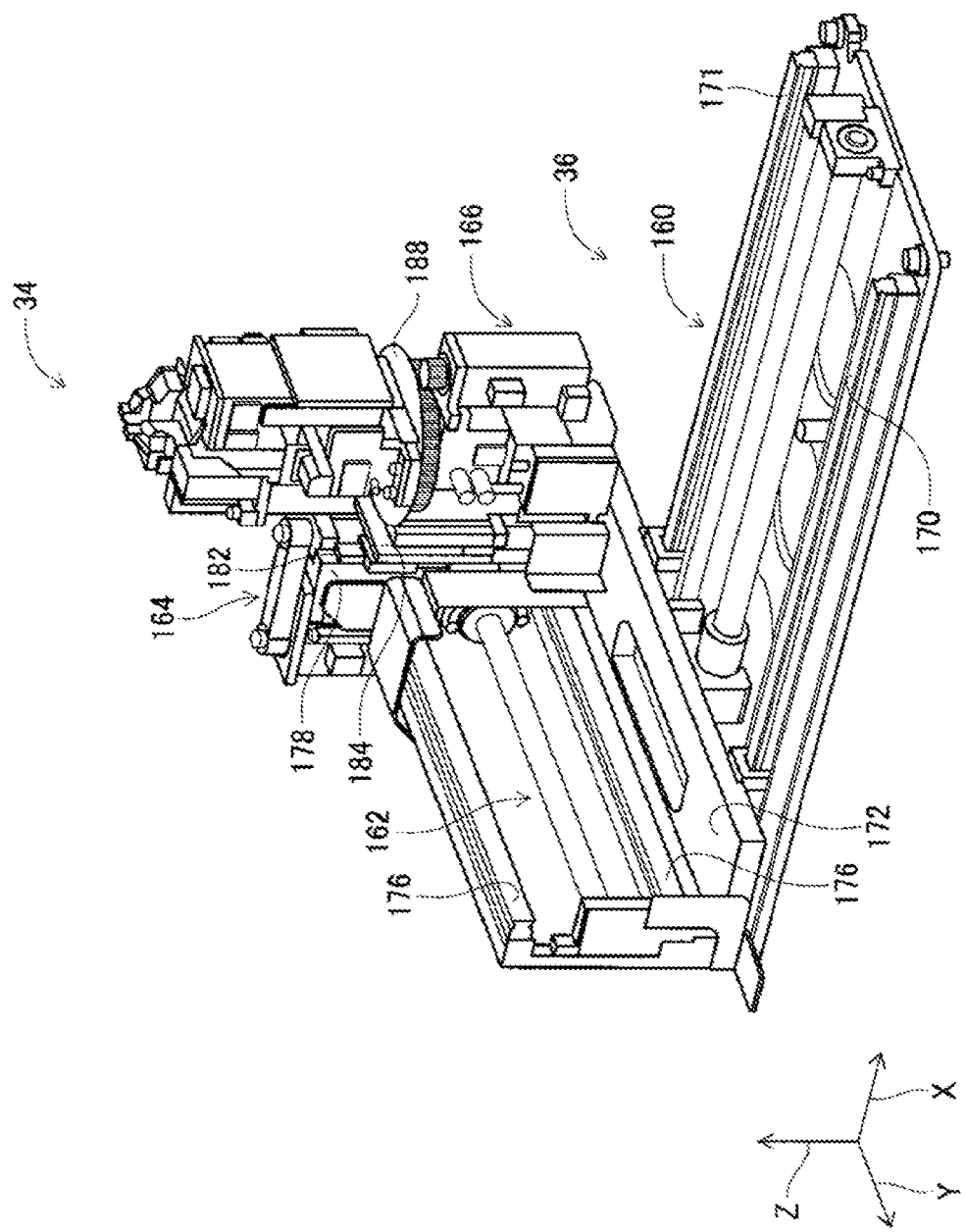
FIG. 6 is a perspective view of a cut and clinch unit and a unit moving device.

Also, as shown in FIG. 6, unit moving device 36 includes X-direction moving device 160, Y-direction moving device 162, Z-direction moving device 164, and rotation device 166. X-direction moving device 160 includes slide rails 170 and 171 and X slider 172. Slide rails 170 and 171 extend in the X direction, and X slider 172 is slidably supported on X slide rails 170 and 171. X slider 172 moves in the X direction by the driving of electromagnetic motor 174 (refer to FIG. 7).

Y-direction moving device 162 includes slide rail 176 and Y slider 178. Slide rail 176 is arranged on X slider 172 extending in the Y direction, and Y slider 178 is slidably supported on slide rail 176. Y slider 178 moves in the Y direction by the driving of electromagnetic motor 180 (refer to FIG. 7). Z-direction moving device 164 includes slide rail 182 and Z slider 184. Slide rail 182 is arranged on Y slider 178 extending in the Z direction, and Z slider 184 is slidably supported on slide rail 182. Z slider 184 moves in the Z direction by the driving of electromagnetic motor 186 (refer to FIG. 7).

Further, rotation device 166 includes rotating table 188 that is substantially disc-shaped. Rotating table 188 is supported by Z slider 184 so as to be rotatable around its own center, and is rotated by the driving of electromagnetic motor 189 (refer to FIG. 7). Cut and clinch unit 34 is arranged on rotating table 188. According to such a configuration, cut and clinch unit 34 can be moved to any position by X-direction moving device 160, Y-direction moving device 162, and Z-direction moving device 164, and can be rotated to any angle by rotation device 166. Thus, cut and clinch unit 34 can be positioned at any position under circuit board 12 held by clamp device 102 of board conveying and holding device 32.

Figure 7:
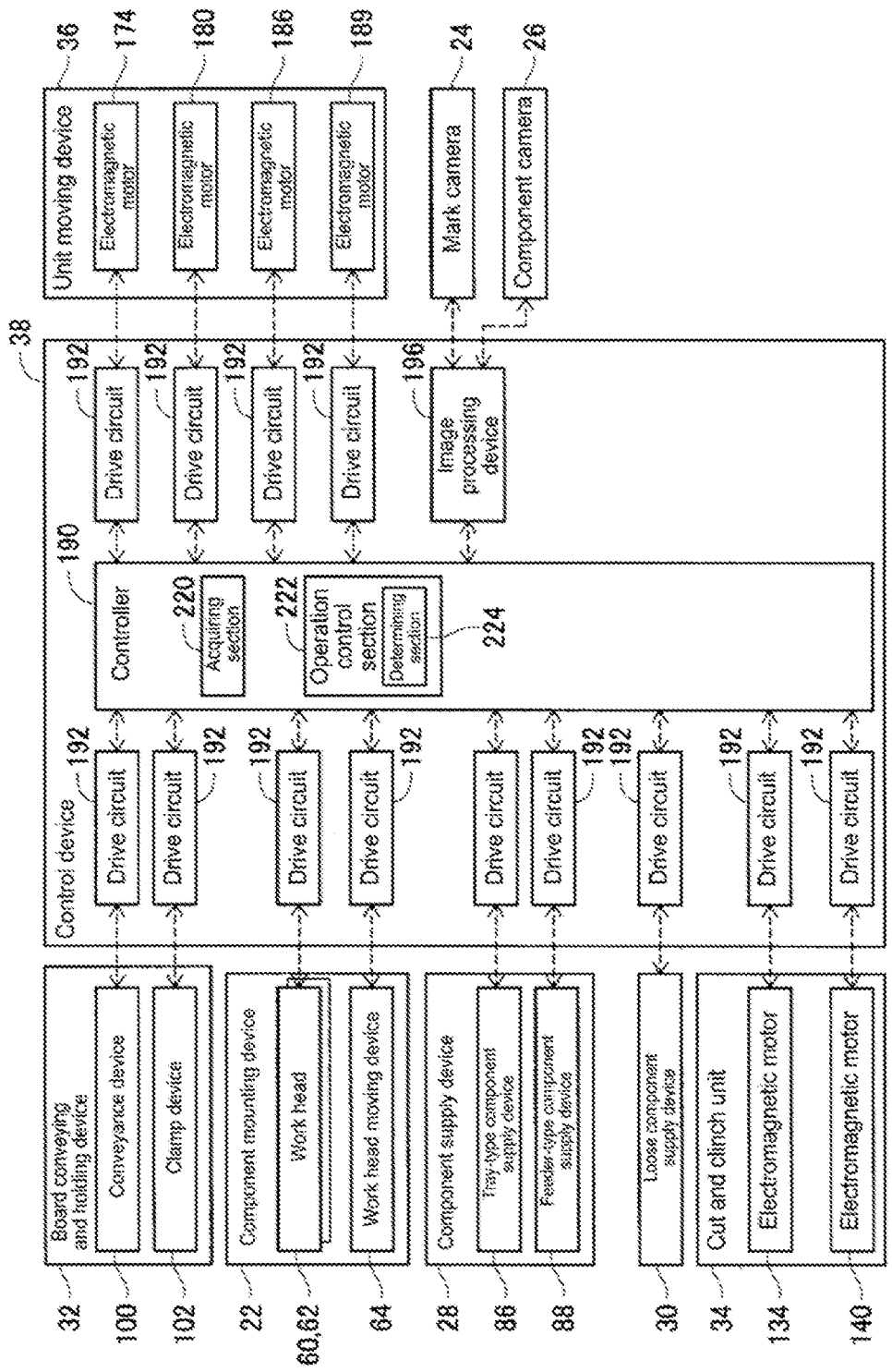
FIG. 7 is a block diagram showing a control device.

As shown in FIG. 7, control device 38 is provided with controller 190, multiple drive circuits 192, and image processing device 196. The multiple drive circuits 192 are connected to work heads 60 and 62, work head moving device 64, tray-type component supply device 78, feeder-type component supply device 80, loose component supply device 30, conveyance device 100, clamp device 102, and electromagnetic motors 134, 140, 174, 180, 186, and 189. Controller 190 is provided with a CPU, ROM, RAM, and so on, is formed mainly from a computer, and is connected to the multiple drive circuits 192. Thus, operation of items such as component mounting device 22 and component supply device 28 is controlled by controller 190. Controller 190 is also connected to image processing device 196. Image processing device 196 is for processing image data acquired by mark camera 24 and component camera 26, and controller 190 acquires various information from the image data.

(B) Component Mounter Operation

Component mounter 10, according to the above configuration, mounts components on circuit board 12 held by board conveying and holding device 32. With component mounter 10, it is possible to mount various components to circuit board 12, but descriptions are given below of a case in which leaded components 200 (refer to FIG. 5) are mounted on circuit board 12.

Specifically, circuit board 12 is conveyed to a work position by conveyance device 100, and is fixedly held at that position by clamp device 102. Next, mark camera 24 moves above circuit board 12 and images circuit board 12. By this, information related to a holding position of circuit board 12 is obtained. Also, component supply device 28 or loose component supply device 30 supplies leaded components 200 at a specified supply position. One of the work heads 60 or 62 moves above the component supply position and picks up and holds component main body section 202 of a leaded component 200 (refer to FIG. 5) using suction nozzle 66.

Continuing, work head 60 or 62 holding leaded component 200 is moved above component camera 26, and leaded component 200 held by suction nozzle 66 is imaged by component camera 26. Accordingly, information related to the holding position of the component is obtained. Continuing, work head 60 or 62 holding leaded component 200 moves above circuit board 12, and corrects the error in the holding position of circuit board 12 and the error in the holding position of the component and so on. Then, leads 204 (refer to FIG. 5) of leaded component 200 held by suction nozzle 66 are inserted into two through-holes 206 (refer to FIG. 5) formed in circuit board 12. Here, cut and clinch unit 34 is moved below circuit board 206.

Specifically, with cut and clinch unit 34, the distance between the pair of slide bodies 130 is adjusted such that the distance between the pair of second insertion holes 156 of movable section 138 of pair of slide bodies 130 is the same as the distance between the two through-holes 206 formed in circuit board 12. Also, cut and clinch unit 34 is moved by operation of X-direction moving device 160 and Y-direction moving device 162 such that the coordinates in the XY directions of the second insertion holes 156 of slide bodies 130 are aligned with the coordinates in the XY directions of through-holes 206 of circuit board 12. Thus, by cut and clinch unit 34 moving in the XY directions, second insertion holes 156 of slide body 130 and through-holes 206 of circuit board 12 are positioned overlapping in the vertical direction.

Next, cut and clinch unit 34 is raised by operation of Z-direction moving device 164 such that the upper surface of movable section 138 contacts the lower surface of circuit board 12 or is positioned slightly below the lower surface of circuit board 12. In this manner, by controlling operation of X-direction moving device 160, Y-direction moving device 162, and Z-direction moving device 164, cut and clinch unit 34 is arranged below circuit board in a state with the second insertion holes 156 of slide body 130 overlapping with through-holes 206 of circuit board 12.

Then, when leads 204 of leaded component 200 held by suction nozzle 66 are inserted into through-holes 206 of circuit board 12, as shown in FIG. 5, the end section of leads 204 is inserted into first insertion hole 150 of fixed section 156 through second insertion hole 156 of movable section 138 of cut and clinch unit 34. Next, when the tip section of lead 204 has been inserted into first insertion hole 150 of fixed section 136, movable section 138 is slid by operation of electromagnetic motor 140.

Thus, lead 204 is cut by fixed blade 152 of first insertion hole 150 and movable blade 158 of second insertion hole 156. Then, the new tip section of lead 204 formed by the cutting is bent in accordance with the sliding of movable section 138. Thus, leaded component 200 is mounted into circuit board 12 in a state in which leads 204 are prevented from coming out of through-holes 206.

In this manner, with component mounter 10, lead 204 is inserted into through-hole 206 in a state with through-hole 206 of circuit board 12 and second insertion hole 156 of cut and clinch unit 34 overlapping in a vertical direction. Then, leads 204 are cut and bent by cut and clinch unit 34 to complete mounting of leaded component 200 onto circuit board 12. Note that, when cut and clinch unit 34 is moved such that through-hole 206 of circuit board 12 and second insertion hole 156 of cut and clinch unit 34 overlap in a vertical direction, operation of unit moving device 36 is controlled based on the position of through-hole 206.

In detail, the coordinates in the XY directions of through-hole 206 into which leaded component 200 is to be inserted are memorized in control device 38 as part of the mounting program. Further, the coordinates of through-hole 206 in the XY directions are corrected based on the error in the holding position of circuit board 12 and the like. The corrected coordinates of through-hole 206 are the planned insertion position of lead 204. Further, operation of unit moving device 36 is controlled such that the planned insertion position and the coordinates in the XY directions of second insertion hole 156 of cut and clinch unit 34 match. Thus, through-hole 206 of circuit board 12 and second insertion hole 156 of cut and clinch unit 34 overlap in a vertical direction, and lead 204 can be appropriately cut and bent by being inserted into second insertion hole 156.

(C) Control of Unit Moving Device when Changing the Rail Spacing Distance

Further, with component mounter 10, as described above, by changing the rail spacing distance in board conveying and holding device 32, it is possible to convey circuit boards 12 of various sizes, and to perform mounting work with respect to circuit boards 12 of various sizes. However, there are cases in which the movable range of cut and clinch unit 34 by unit moving device 36 exceeds outside the gap between the pair of guide rails 106 of board conveying and holding device 32 due to the changing of the rail spacing distance. In such a case, there is a worry that cut and clinch unit 34 will interfere with a side wall or the like that configures housing 128 or guide rail 108 of board conveying and holding device 32.

Figure 8:
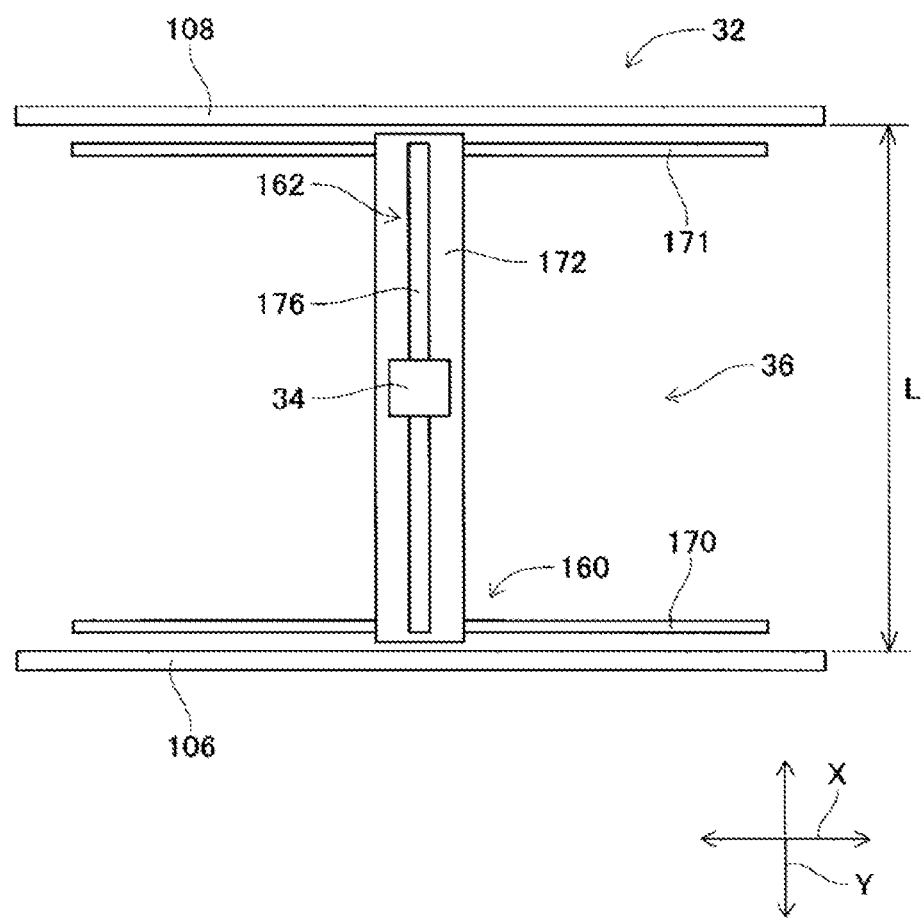
FIG. 8 is schematic drawing showing the positional relationship between the conveying and holding device and the unit moving device.

In detail, as shown in FIG. 8, with pair of guide rails 106 and 108 spaced a maximum distance apart, unit moving device is positioned under pair of guide rails 106 and 108 and between pair of guide rails 106 and 108. That, with rail spacing distance L at its largest, unit moving device 36 is arranged within the range of the XY coordinates of pair of guide rails 106 and 108. Thus, cut and clinch unit 34 can move in the entire region under circuit board 12 supported by guide rails 106 and 108 with largest rail spacing distance L to cut and bend leads 204 inserted into through-holes 206 of circuit board 12.

Figure 9:
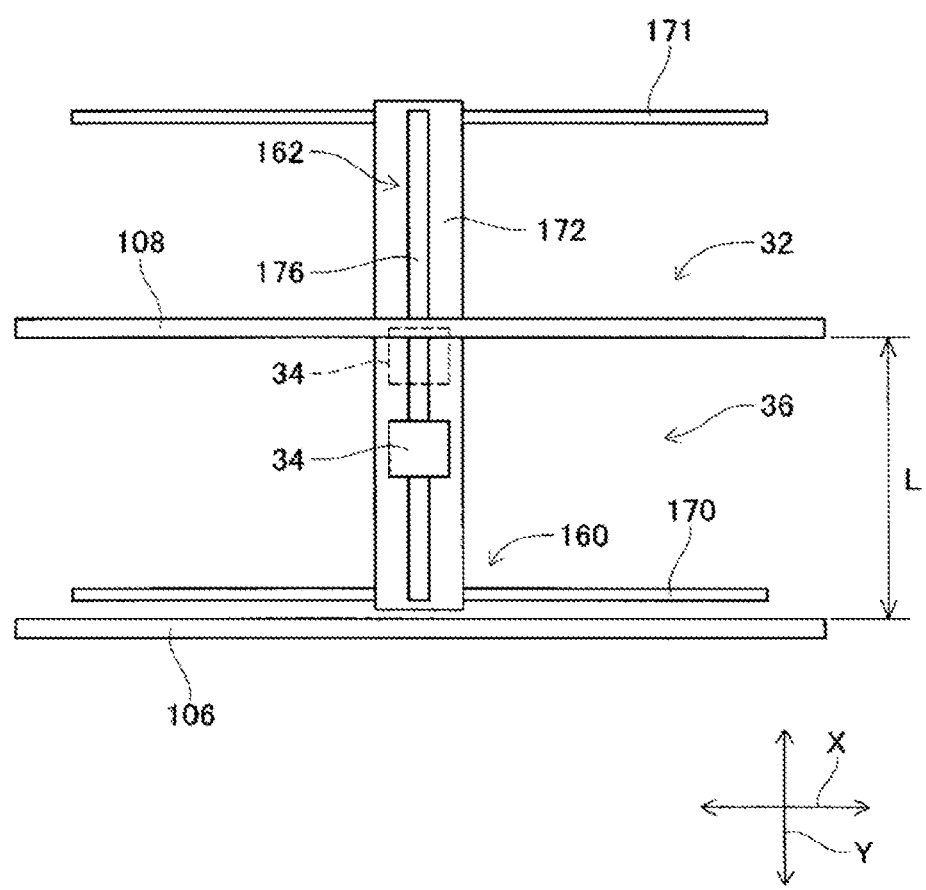
FIG. 9 is a schematic drawing showing the positional relationship between the conveying and holding device and the unit moving device.

However, as shown in FIG. 9, if rail spacing distance L is made shorter, a portion of unit moving device 36 is positioned outside pair of guide rails 106 and 108. In detail, slide rail 170 of X-direction moving device 160 that configures unit moving device 36 is positioned between pair of guide rails 106 and 108, but slide rail 171 is positioned outside pair of guide rails 106 and 108. Further, the end of X-slider 172 of X-direction moving device 160 on the slide rail 171 side is also outside pair of guide rails 106 and 108. Thus, the end of slide rail 176 of Y-direction moving device 162 that configures unit moving device 36 on the slide rail 171 side is positioned outside pair of guide rails 106 and 108.

Therefore, when cut and clinch unit 34 is moved close to slide rail 171 by Y-direction moving device 162, there is a danger that cut and clinch unit 34 will interfere with guide rail 108 or the like of board conveying and holding device 32 (refer to dashed line in FIG. 9). Considering this, with component mounter 10, during mounting work, unit moving device 36 is controlled based on the rail spacing distance so as to prevent interference between cut and clinch unit 34 and board conveying and holding device 32.

Specifically, when the rail spacing distance changes in accordance with a change in the type of circuit board 12, controller 190 may change the rail spacing distance when starting production or the like. Note that, the rail spacing distance is calculated based on an output value of electromagnetic motor 122 of changing mechanism 120 that slides guide rail 108, that is, based on the encoder provided in electromagnetic motor 122. Further, based on the rail spacing distance, controller 190 calculates the movement range of second insertion hole 156 when cut and clinch unit 34 moves (hereinafter also referred to as "insertion hole movement range) to prevent interference between cut and clinch unit 34 and board conveying and holding device 32.

Note that, the insertion hole movement range is range for when cut and clinch unit 34 is moved by X-direction moving device 160 and Y-direction moving device 162, and is represented by coordinates in the XY directions. Further, the insertion hole movement range is not simply the rail spacing distance, but is calculated considering the external dimensions of cut and clinch unit 34, the internal dimensions of board conveying and holding device 32, and clearances between board conveying and holding device 32 and cut and clinch unit 34. Further, during mounting work of leaded component 200, operation of unit moving device 36 is controlled such that cut and clinch unit 34 is not moved to exceed beyond the insertion hole movement range.

In detail, as described above, the coordinates in the XY directions of through-hole 206 into which leaded component 200 is to be inserted are memorized in control device 38 as part of the mounting program, and the coordinates in the XY directions are corrected based on an error or the like in the holding position of circuit board 12. Further, operation of unit moving device 36 is controlled such that the corrected coordinates (also referred to as "corrected planned insertion coordinates") and the coordinates in the XY direction of second insertion hole 156 of cut and clinch unit 34 match.

Note that, as a control program, since the coordinates in the XY directions of through-hole 206 memorized in control device 38 are set in accordance with the size of circuit board 12, normally, the corrected planned insertion coordinates are positioned inside the insertion hole movement range. However, when the coordinates in the XY directions of through-hole 206 are inputted as part of the control program, there are cases in which incorrect values are inputted. In such a case, the corrected planned insertion coordinates may be positioned outside the insertion hole movement range. Further, the coordinates of through-hole 206 as part of the control program are corrected based on the holding position of circuit board 12 or the like, but if the coordinates of through-hole 206 are corrected by a large amount, the corrected planned insertion coordinates may be positioned outside the insertion hole movement range.

In this manner, in a case in which the corrected planned insertion coordinates are outside the insertion hole movement range, when second insertion hole 156 of cut and clinch unit 34 is moved to the corrected planned insertion coordinates, interference will occur between the board conveying and holding device 32 and cut and clinch unit 34. On the other hand, in a case in which the corrected planned insertion coordinates are inside the insertion hole movement range, when second insertion hole 156 of cut and clinch unit 34 is moved to the corrected planned insertion coordinates, interference will not occur between the board conveying and holding device 32 and cut and clinch unit 34.

Note that, before operation of unit moving device 36 is controlled, controller 190 determines whether the corrected planned insertion coordinates are inside the insertion hole movement range. Further, in a case in which it is determined that the corrected planned insertion coordinates are inside the insertion hole movement range, operation of unit moving device 36 is controlled such that second insertion hole 156 of cut and clinch unit 34 moves to the corrected planned insertion coordinates.

On the other hand, in a case in which it is determined that the corrected planned insertion coordinates are outside the insertion hole movement range, operation of unit moving device 36 is not controlled, that is, cut and clinch unit 34 is not moved, and an error screen is displayed on a display panel 210 (see FIG. 1) of component mounter 10. Note that, a comment indicating that mounting work has been stopped due to the danger of interference between board conveying and holding device 32 and cut and clinch unit 34 is displayed on the error screen. In this manner, by controlling operation of unit moving device 36 based on the rail spacing distance, it is possible to prevent interference between cut and clinch unit 34 and board conveying and holding device 32.

Note that, as shown in FIG. 7, controller 190 of control device 38 includes acquiring section 220 and operation control section 222, and operation control section 222 includes determining section 224. Acquiring section 220 is a functional section for acquiring the rail spacing distance. Determining section 224 is a functional section for calculating the insertion hole movement range based on the rail spacing distance and determining whether the corrected planned insertion coordinates are positioned inside the insertion hole movement range. That is, determining section 224 is a functional section for determining whether interference will occur between cut and clinch unit 34 and board conveying and holding device 32 during operation of unit moving device 36. Operation control section 222 is a functional section for controlling operation of unit moving device 36 such that second insertion hole 156 of cut and clinch unit 34 moves to corrected planned insertion coordinates when the corrected planned insertion coordinates are positioned inside the insertion hole movement range. Further, operation control section 222 is a functional section for displaying an error screen on a display panel when the corrected planned insertion coordinates are positioned outside the insertion hole movement range.

Note that, component mounter 10 is an example of a board work system. Conveying and holding device 32 is an example of a conveying and holding device. Cut and clinch unit 34 is an example of a work device. Unit moving device 26 is an example of a moving device. Control device 38 is an example of a control device. Guide rails 106 and 108 are examples of a guide rail. Changing mechanism 120 is an example of a changing mechanism. Acquiring section 220 is an example of an acquiring section. Operation control section 222 is an example of an operation control section. Determining section 224 is an example of a determining section.

Further, the present disclosure is not limited to the above example embodiments, and various changed or improved methods of embodiment are possible based on the knowledge of someone skilled in the art. Specifically, for example, in an embodiment above, the rail spacing distance is calculated based on an output value of electromagnetic motor 122 of changing mechanism 120, but the rail spacing distance may be calculated by imaging guide rail 108 using mark camera 24 and calculating the rail spacing distance based on the acquired image data. Further, in a case in which the size or the like of circuit board on which work is to be performed is input as part of the control program, the rail spacing distance may be calculated based on the size or the like of circuit board 12.

Further, in an embodiment above, the disclosure is applied to cut and clinch unit 34, but the disclosure may be applied to various work devices, so long as the device is configured to perform work with respect to the underside of circuit board 12 held by board conveying and holding device 32. Specifically, for example, the disclosure may be applied to a work device that applies a viscous fluid such as solder to leads 204 of leaded component 200 inserted into through-holes 206 of circuit board 12. Further, the disclosure may be applied to a work device that performs assembly work such as tightening screws from the underside of circuit board 12.

Further, in an embodiment above, operation of unit moving device 36 is controlled during mounting work based on the rail spacing distance, however, operation of unit moving device 36 may be controlled based on the rail spacing distance during operation checking, maintenance, or the like. Specifically, for example, when an operator operates unit moving device 36 by using operation buttons or the like, controller 190 may stop operation of unit moving device 36 before second insertion hole 156 of cut and clinch unit 34 moves outside the external insertion hole movement range.

Further, in an embodiment above, the insertion hole movement range is calculated based on the rail spacing distance, and it is determined whether interference will occur between board conveying and holding device 32 and cut and clinch unit 34 using the insertion hole movement range, but determination may be performed by other means. Specifically, for example, the position of a member that may interfere with cut and clinch unit 34, such as guide rail 108, may be calculated based on the rail spacing distance, and it may be determined whether interference will occur with board conveying and holding device 32 based on that position.

REFERENCE SIGNS LIST

10: component mounter (board work system);
32: board conveying and holding device (conveying and holding device);
34: cut and clinch unit (work device);
36: unit moving device (moving device);
38: control device;
106: guide rail (rail);
108: guide rail (rail);
120: changing mechanism;
220: acquiring section;
222: operation control section;
224: determining section

The invention claimed is:
1. A board work system comprising:
a conveying and holding device including a pair of rails extending in a first direction configured to support a board, and a changing mechanism configured to change a distance in a second direction between the pair of rails, the conveying and holding device being configured to convey the board supported by the rails and hold the board at a work position;
a cut and clinch device configured to perform work with respect to the board held by the conveying and holding device from an underside of the board, the cut and clinch device including a pair of slide bodies slidably supported by slide rails;

a moving device configured to move the cut and clinch device, the moving device including a slide rail extending in the second direction and a slider which is slidably supported on the slide rail; and a control device configured to acquire a rail spacing distance that is the distance between the pair of rails, calculate a movement range of the cut and clinch device based on the rail spacing distance, determine whether interference will occur between the cut and clinch device and the conveying and holding device when the cut and clinch device is moved to a predetermined set position based on the movement range, control operation of the moving device to move the cut and clinch device to the predetermined set position when it is determined that interference will not occur between the cut and clinch device and the conveying and holding device, and issue a notice indicating that interference will occur when it is determined that interference will occur between the cut and clinch device and the conveying and holding device.

2. The board work system according to claim 1, wherein each of the pair of slide bodies of the cut and clinch device includes a fixed section and a movable section, an upper end section of the fixed section including an insertion hole, an edge of the insertion hole formed as a fixed blade, and an upper end section of the movable section including an L-shaped curved section.

* * * * *